United States Patent
Chen et al.

(10) Patent No.: US 7,285,491 B2
(45) Date of Patent: Oct. 23, 2007

(54) SALICIDE PROCESS

(75) Inventors: Min-Hsian Chen, Hsinchu County (TW); Ching-Hsing Hsieh, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/553,477

(22) Filed: Oct. 27, 2006

(65) Prior Publication Data

US 2007/0048986 A1 Mar. 1, 2007

Related U.S. Application Data

(62) Division of application No. 10/907,710, filed on Apr. 13, 2005, now Pat. No. 7,238,611.

(51) Int. Cl.
*H01L 21/44* (2006.01)

(52) U.S. Cl. ............... 438/648; 438/649; 438/651; 438/664; 438/581; 438/583

(58) Field of Classification Search ........... 438/581, 438/583, 649, 651, 664
See application file for complete search history.

(56) References Cited

U.S. PATENT DOCUMENTS

| | | | |
|---|---|---|---|
| 2005/0236715 A1* | 10/2005 | Ku et al. ............. | 257/768 |
| 2006/0057844 A1* | 3/2006 | Domenicucci et al. ...... | 438/655 |
| 2006/0141657 A1* | 6/2006 | Ohnuma et al. ............. | 438/48 |
| 2006/0194399 A1* | 8/2006 | Wen et al. ................ | 438/305 |
| 2006/0199324 A1* | 9/2006 | Yu et al. ................... | 438/199 |

* cited by examiner

*Primary Examiner*—Thao P. Le
(74) *Attorney, Agent, or Firm*—Jianq Chyun IP Office

(57) ABSTRACT

A salicide process is provided. A metal layer selected from a group consisting of nickel and an alloy thereof is formed on a silicon layer, the first step of the second thermal process is performed at 300~400 degrees centigrade for 10~60 seconds and the second step of the second thermal process is performed at 450~550 degrees centigrade for 10~60 seconds.

8 Claims, 3 Drawing Sheets

SALICIDE PROCESS

CROSS-REFERENCE TO RELATED APPLICATION

This is a divisional application of patent application Ser. No. 10/907,710, filed on Apr. 13, 2005, now U.S. Pat. No. 7,238,611. The entirety of the above-mentioned patent application is hereby incorporated by reference herein and made a part of this specification.

BACKGROUND OF THE INVENTION

1. Field of the Invention

The present invention generally relates to a semiconductor process. More particularly, the present invention relates to a salicide process.

2. Description of Related Art

Semiconductor device improvements have been largely accomplished by reducing device feature size while predictions for future device sizes do not foresee an end to the trend of ever smaller and denser devices. Reduction in MOS transistor device feature size brings with it reduction in film thickness while the depth of diffusion regions is also reduced. For the salicide process that is used to establish electrical contacts with the active regions, a metal layer is formed over these active regions (the source/drain region and the gate electrode) and subjected to a thermal process.

For several salicide processes, such as titanium and cobalt salicide processes, two thermal processes for annealing are conducted because these metal silicides have two-phase transition temperatures. The two thermal processes cause a first phase transfer during the first thermal process and then the first phase of the metal silicide is changed into a second phase by the second thermal process.

Usually, the first thermal process and the second thermal process are one-step thermal process respectively which are performed from a room temperature to a predetermined temperature. However, the metal silicide formed by the conventional two thermal processes causes rough and non-uniform grains because the metal silicide grains grow so rapidly that junction leakage is easily occurred and metal silicide sheet resistance is deteriorated.

SUMMARY OF THE INVENTION

Accordingly, the present invention is directed to a salicide process capable of solving the problems of metal silicide sheet resistance and junction leakage.

According to an embodiment of the present invention, a salicide process is provided. A metal layer selected from a group consisting of titanium (Ti), cobalt (Co), platinum (Pt), palladium (Pd) and an alloy thereof is formed over a silicon layer. A first thermal process is performed. Next, a second thermal process is performed, wherein the second thermal process comprises a first step performed at 600~700 degrees centigrade for 10~60 seconds and a second step performed at 750~850 degrees centigrade for 10~60 seconds.

According to another embodiment of the present invention, a salicide process is provided. A metal layer selected from a group consisting of nickel and an alloy thereof is formed over a silicon layer. A first thermal process is performed. Next, a second thermal process is performed, the second thermal process comprises a first step performed at 300~400 degrees centigrade for 10~60 seconds and a second step performed at 450~550 degrees centigrade for 10~60 seconds.

The second thermal process is conducted with two steps in which the first step is for nucleation while the second step is for grain growing so that the metal silicide grain roughness can be avoided and the metal silicide grain uniformity can be improved. Hence, metal silicide sheet resistance and junction leakage can be reduced.

BRIEF DESCRIPTION OF THE DRAWINGS

The accompanying drawing is included to provide a further understanding of the invention, and is incorporated in and constitutes a part of this specification. The drawing illustrates embodiments of the invention and, together with the description, serves to explain the principles of the invention.

DESCRIPTION OF THE EMBODIMENTS

Reference will now be made in detail to the present preferred embodiments of the invention, examples of which are illustrated in the accompanying drawing.

Figure 1:
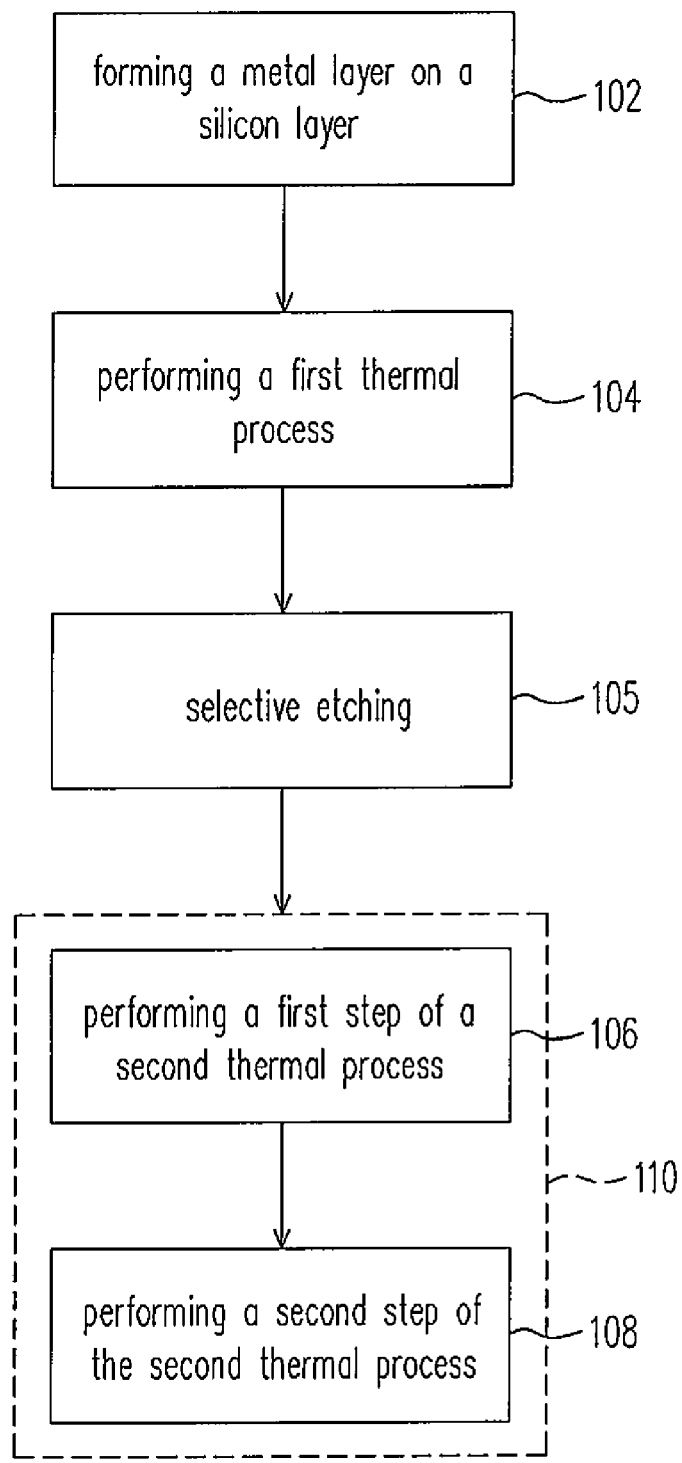
FIG. 1 is a flow chart showing a salicide process according to an embodiment of the present invention.

FIG. 1 is a flow chart showing a salicide process according to an embodiment of the present invention. As shown in FIG. 1, the salicide process of the present invention comprises the following steps, 102~108. First, a metal layer is formed over a silicon layer (step 102). In an embodiment, the metal layer is selected from titanium, cobalt, platinum, palladium and an alloy thereof, for example. In another embodiment, the metal layer is selected from nickel and an alloy thereof, for example. The metal layer is formed with a sputtering deposition process, an evaporation process or other suitable deposition process. The silicon layer may be a silicon substrate, a polysilicon layer and the like. In an embodiment, the silicon layer comprises a source region, a drain region and a gate electrode of a MOS transistor, for example.

After step 102, a first thermal process is performed (step 104). In an embodiment, the first thermal process is a rapid thermal annealing process or other suitable thermal process. The first thermal process can be a one-step thermal process, for example. If the metal layer formed on the silicon layer is selected from titanium, cobalt, platinum, palladium and an alloy thereof, the one-step first thermal process is performed at 450~550 degrees centigrade for 10~60 seconds, for example. If the metal layer formed on the silicon layer is selected from nickel and an alloy thereof, the one-step first thermal process is performed at 250~400 degrees centigrade for 10~60 seconds, for example. When the first thermal process is carried out, the metal layer reacts with the underlying silicon layer to form a first phase of a metal silicide.

In a preferred embodiment, after step 104, a selective etching step 105 is performed to remove the non-reactive metal layer. Then, a second thermal process 110 is performed. In particular, the second thermal process 110 includes a first step 106 and a second step 108. In other words, after the first thermal process (step 104) has been carried out, the first step of the second thermal process (step 106) is conducted and then the second step of the second thermal process (step 108) will be performed. The first and second steps of the second thermal processes can be a rapid thermal annealing process respectively, for example.

In an embodiment, if the metal layer formed on the silicon layer is selected from titanium, cobalt, platinum, palladium and an alloy thereof, the first step of the second thermal process (step 106) is performed at 600~700 degrees centigrade for 10~60 seconds, for example. The second step of the second thermal process (step 108) is performed at 750~850 degrees centigrade for 10~60 seconds. Preferably, the first step of the second thermal process (step 106) is performed at 630~670 degrees centigrade for 20~40 seconds, for example, and the second step of the second thermal process (step 108) is performed at 780~820 degrees centigrade for 20~40 seconds, for example.

In another embodiment, if the metal layer formed on the silicon layer is selected from nickel and an alloy thereof, the first step of the second thermal process (step 106) is performed at 300~400 degrees centigrade for 10~60 seconds, for example. The second step of the second thermal process (step 108) is performed at 450~550 degrees centigrade for 10~60 seconds. Preferably, the first step of the second thermal process (step 106) is performed at 330~370 degrees centigrade for 20~40 seconds, for example. The second step of the second thermal process (step 108) is performed at 480~520 degrees centigrade for 20~40 seconds, for example.

When the second thermal process is carried out, the first phase of the metal silicide is changed into a second phase. In particular, the second thermal process of the present invention is performed by two-step annealing. The first step of the second thermal process is performed for nucleation while the second step of the second thermal process is carried out for grain growing. In other words, after the nucleation reaction (first step) has been completed, the grain growing is conducted so that both the nucleation reaction and the grain growing can be performed completely. Therefore, the grains of the metal silicide become smooth and uniform that the metal salicide sheet resistance can be reduced and junction leakage can be avoided.

Figure 2:
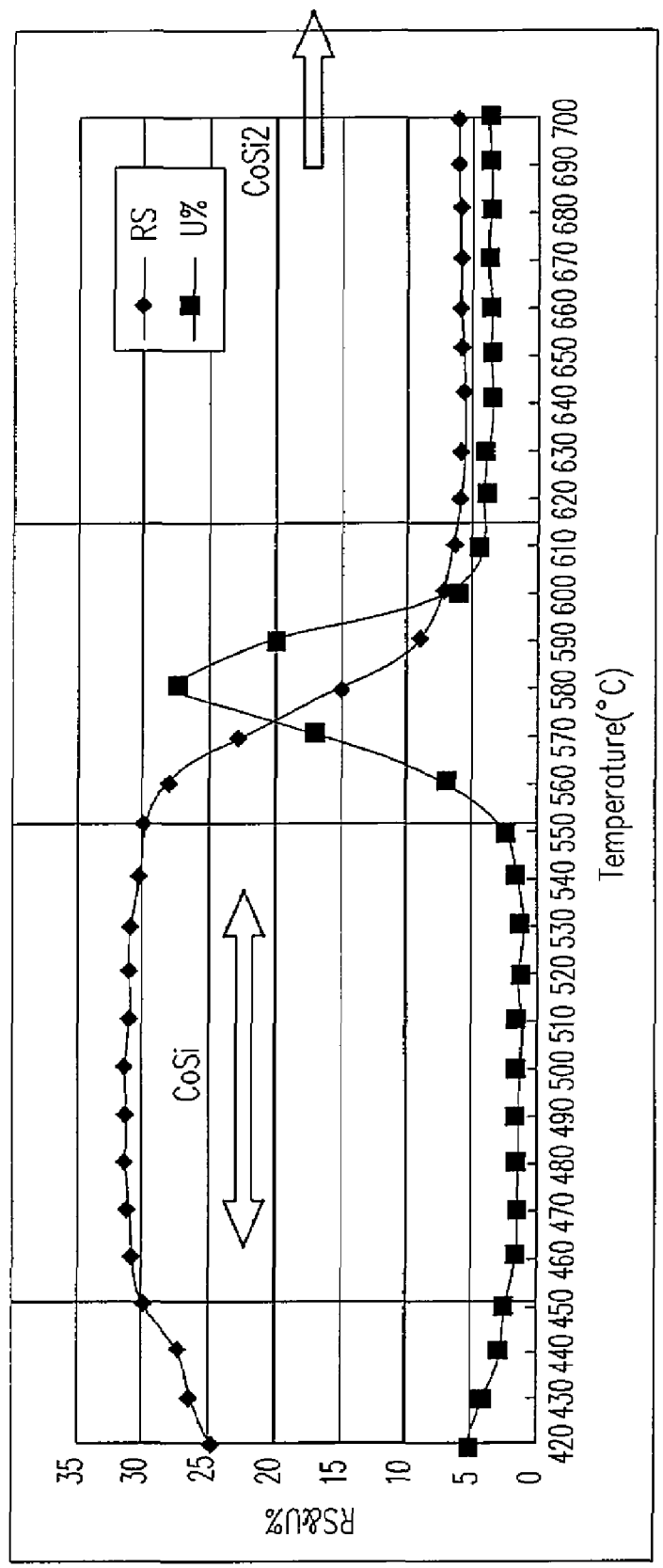
FIG. 2 is a diagram showing a relationship between the thermal process temperature and the grain uniformity (U %) and the metal silicide sheet resistance (RS) of a cobalt salicide process according to an embodiment of the present invention.
Figure 3:
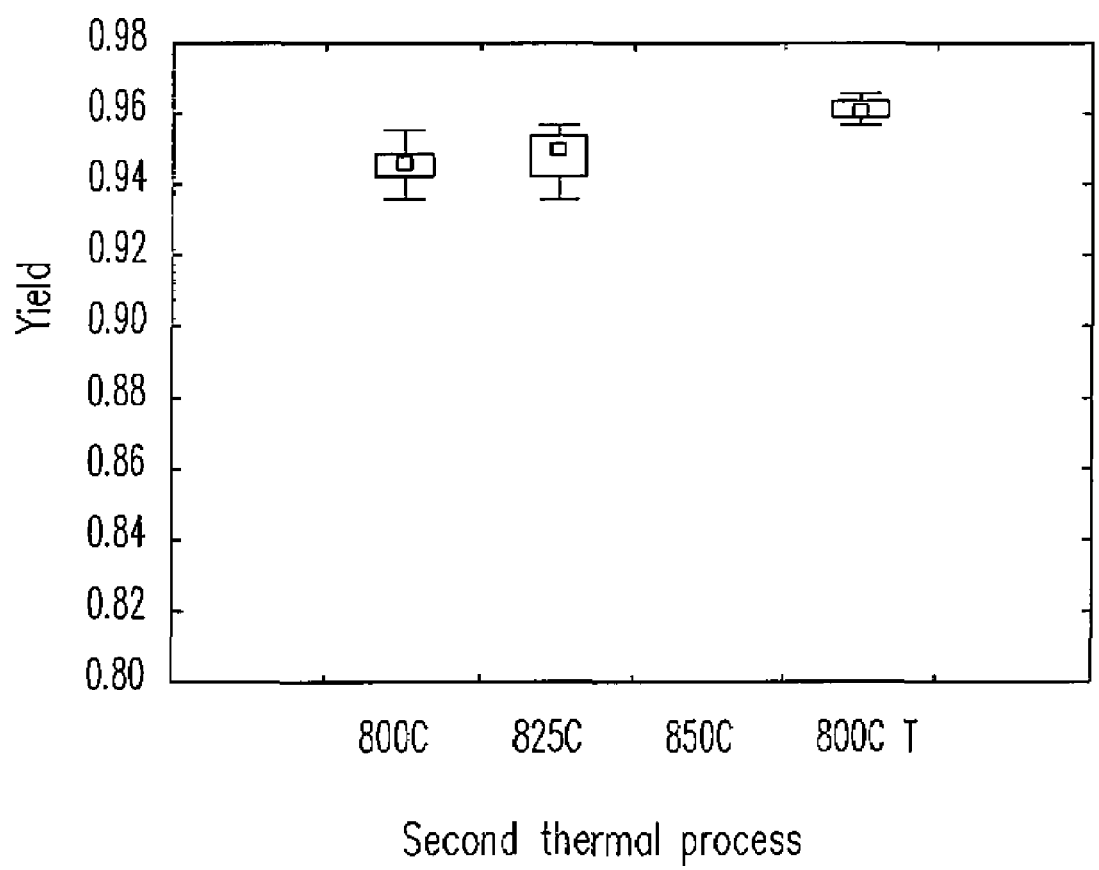
FIG. 3 is a diagram showing a relationship between the one-step and two-step second thermal processes and the product yield.

FIG. 2 is a diagram showing a relationship between the thermal process temperature and the grain uniformity (U %) and the metal silicide sheet resistance (RS) of a cobalt salicide process according to an embodiment of the present invention. As shown in FIG. 2, when the first thermal process is conducted at 450~550 degrees centigrade for 10~60 seconds, the grain uniformity (U %) and the metal silicide sheet resistance (RS) are poor. When the second thermal process is carried out at 600~700 degrees centigrade for 10~60 seconds, the grain uniformity (U %) is increased and the metal silicide sheet resistance (RS) is reduced. Therefore, the second phase of the metal silicide can be formed at 600~700 degrees centigrade. In the present invention, the second thermal process for the second phase of the metal silicide is performed with two-step annealing. The grain uniformity can be improved and the metal silicide sheet resistance can be reduced because both the nucleation reaction (during the first step of the second thermal process) and the grain growing (during the second step of the second thermal process) can be performed completely so that the product yield can be improved. As shown in FIG. 3, the temperature 800 C means the second thermal process is performed with a one-step annealing at 800 degrees centigrade. The temperature 825 C means the second thermal process is performed with a one-step annealing at 825 degrees centigrade. The temperature 800 CT means the second thermal process is performed with a two-step annealing at 800 degrees centigrade. Apparently, if the second thermal process is performed with a two-step annealing, the product yield is better.

After the second thermal process (step 110) is performed, the step of removing the metal layer that is not reacted with the underlying silicon layer may be further carried out. In an embodiment, the method of removing the unreacted metal layer is performing by an etching process, for example. If the salicide process is performed in an MOS transistor process, the metal silicide layer may be formed on the surfaces of the source/drain regions and the gate electrode for providing good electric conductivity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A salicide process, comprising:
   forming a metal layer over a silicon layer, wherein the metal layer is selected from a group consisting of nickel and an alloy thereof;
   performing a first thermal process; and
   performing a second thermal process, wherein the second thermal process comprises a first step for nucleation performed at 300~400 degrees centigrade for 10~60 seconds and a second step for grain growing performed at 450~550 degrees centigrade for 10~60 seconds.

2. The salicide process according to claim 1, wherein the first step of the second thermal process is performed at 330~370 degrees centigrade for 20~40 seconds.

3. The salicide process according to claim 1, wherein the second step of the second thermal process is performed at 480~520 degrees centigrade for 20~40 seconds.

4. The salicide process according to claim 1, wherein the first thermal process is a one-step thermal process.

5. The salicide process according to claim 4, wherein the one-step thermal process performed at 250~400 degrees centigrade for 10~60 seconds.

6. The salicide process according to claim 1, wherein the second thermal process is a rapid thermal annealing process.

7. The salicide process according to claim 1, wherein the first and second steps of the second thermal process is a rapid thermal annealing process, respectively.

8. The salicide process according to claim 1, further comprising performing a selective etching step before the second thermal process is performed.

* * * * *